(12) United States Patent
Baek et al.

(10) Patent No.: US 11,398,618 B2
(45) Date of Patent: Jul. 26, 2022

(54) CONDUCTIVE PATTERN, DISPLAY DEVICE INCLUDING CONDUCTIVE PATTERN, AND METHOD OF MANUFACTURING CONDUCTIVE PATTERN

(71) Applicant: Samsung Display Co., Ltd., Yongin-Si (KR)

(72) Inventors: Gyungmin Baek, Yongin-si (KR); Juhyun Lee, Seongnam-si (KR); Hyuneok Shin, Gwacheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 212 days.

(21) Appl. No.: 16/910,561

(22) Filed: Jun. 24, 2020

(65) Prior Publication Data

US 2021/0043870 A1    Feb. 11, 2021

(30) Foreign Application Priority Data

Aug. 7, 2019   (KR) .................. 10-2019-0096170

(51) Int. Cl.
| | |
|---|---|
| *H01L 51/52* | (2006.01) |
| *H01L 27/32* | (2006.01) |
| *G02F 1/1362* | (2006.01) |
| *G02F 1/1368* | (2006.01) |
| *G02F 1/1333* | (2006.01) |
| *H01L 51/56* | (2006.01) |

(52) U.S. Cl.
CPC ........ *H01L 51/5253* (2013.01); *G02F 1/1368* (2013.01); *G02F 1/13338* (2013.01); *G02F 1/136286* (2013.01); *H01L 27/3225* (2013.01); *H01L 27/3276* (2013.01); *H01L 51/56* (2013.01); *G02F 2203/02* (2013.01); *H01L 2227/323* (2013.01); *H01L 2251/303* (2013.01)

(58) Field of Classification Search
CPC ............ H01L 51/5253; H01L 27/3225; H01L 27/3276; H01L 51/56; H01L 2227/323; H01L 2251/303; H01L 51/5281; H01L 27/124; H01L 51/0021; H01L 51/5203; H01L 51/5237; G02F 1/13338; G02F 1/136286; G02F 1/1368; G02F 2203/02; G02F 1/13629; G02F 1/136295; G02F 1/134309; G02F 1/13439
See application file for complete search history.

(56) References Cited

U.S. PATENT DOCUMENTS

2019/0004616 A1* 1/2019 Baek .................. G06F 3/0445

FOREIGN PATENT DOCUMENTS

| JP | 2018170126 A | 11/2018 |
|---|---|---|
| KR | 1020170067156 A | 6/2017 |

* cited by examiner

*Primary Examiner* — Kyoung Lee
(74) *Attorney, Agent, or Firm* — Cantor Colburn LLP

(57) ABSTRACT

A conductive pattern includes a metal layer and a first low reflective layer disposed on a first surface of the metal layer, the first low reflective layer including niobium carbide (NbC) and zinc oxide (ZnO).

20 Claims, 8 Drawing Sheets

CONDUCTIVE PATTERN, DISPLAY DEVICE INCLUDING CONDUCTIVE PATTERN, AND METHOD OF MANUFACTURING CONDUCTIVE PATTERN

This application claims priority to Korean Patent Application No. 10-2019-0096170, filed on Aug. 7, 2019, and all the benefits accruing therefrom under 35 U.S.C. § 119, the content of which in its entirety is herein incorporated by reference.

BACKGROUND

1. Field

Exemplary embodiments relate to a conductive pattern. More particularly, exemplary embodiments relate to a conductive pattern, a display device including the conductive pattern, and a method of manufacturing the conductive pattern.

2. Description of the Related Art

Electronic devices generally include a conductive pattern, such as wirings or electrodes, to transmit electrical signals. A display device, such as an organic light emitting display device or a liquid crystal display device, generally includes a conductive pattern, such as wirings or electrodes, to transmit electrical signals for displaying an image or electrical signals for sensing an input.

SUMMARY

When external light incident into a display device is reflected by the display device, visibility of the image which the display device displays may be degraded. Because the conductive pattern included in the display device includes materials having a relatively high reflectivity such as metal, etc., the external light incident into the display device may be reflected by the conductive pattern, and the visibility of the image which the display device displays may be degraded.

Exemplary embodiments provide a conductive pattern having a relatively low reflectivity.

Exemplary embodiments provide a display device having a relatively low reflectivity.

Exemplary embodiments provide a method of manufacturing a conductive pattern having a relatively low reflectivity to reduce manufacturing cost and time.

A conductive pattern according to embodiments may include a metal layer and a first low reflective layer disposed on a first surface of the metal layer, the first low reflective layer including niobium carbide (NbC) and zinc oxide (ZnO).

In an exemplary embodiment, an amount of the zinc oxide included in the first low reflective layer may be less than or equal to about 50 atomic percent (%).

In an exemplary embodiment, the first low reflective layer may further include a metal.

In an exemplary embodiment, the metal may include aluminum (Al).

In an exemplary embodiment, an amount of the metal included in the first low reflective layer may be less than or equal to about 5 mass percent.

In an exemplary embodiment, the conductive pattern further include a second low reflective layer disposed on a second surface of the metal layer opposite to the first surface, the second low reflective layer including niobium carbide and zinc oxide.

In an exemplary embodiment, an amount of the zinc oxide included in the second low reflective layer may be substantially equal to an amount of the zinc oxide included in the first low reflective layer.

In an exemplary embodiment, a sidewall of the first low reflective layer may contact a sidewall of the metal layer.

In an exemplary embodiment, a thickness of the first low reflective layer may be less than a thickness of the metal layer.

In an exemplary embodiment, the metal layer may include at least one of copper (Cu), aluminum (Al), titanium (Ti), and molybdenum (Mo).

A display device according to embodiments may include a substrate, a transistor disposed on the substrate, a display element disposed on the transistor, an encapsulation layer covering the display element, and a conductive pattern disposed between the substrate and the encapsulation layer or on the encapsulation layer. The conductive pattern may include a metal layer and a first low reflective layer disposed on a first surface of the metal layer, the first low reflective layer including niobium carbide (NbC) and zinc oxide (ZnO).

In an exemplary embodiment, the metal layer may be disposed between the substrate and the first low reflective layer.

In an exemplary embodiment, the first low reflective layer may be disposed between the substrate and the metal layer.

In an exemplary embodiment, the conductive pattern may further include a second low reflective layer disposed on a second surface of the metal layer opposite to the first surface, the second low reflective layer including niobium carbide and zinc oxide.

In an exemplary embodiment, the conductive pattern may be disposed between the substrate and the encapsulation layer, and may be a gate line for transmitting a gate signal to the transistor or a data line for transmitting a data signal to the transistor.

In an exemplary embodiment, the conductive pattern may be disposed on the encapsulation layer, and may be a sensing electrode for sensing an input from a user.

A method of manufacturing a conductive pattern according to embodiments may include forming a metal material layer, forming a first low reflective material layer on a first surface of the metal material layer, the first low reflective material layer including niobium carbide (NbC) and zinc oxide (ZnO), and integrally etching the metal material layer and the first low reflective material layer by an etchant.

In an exemplary embodiment, an amount of the zinc oxide included in the first low reflective material layer may be less than or equal to about 50 at. %.

In an exemplary embodiment, an etch rate of the metal material layer by the etchant may be substantially equal to an etch rate of the first low reflective material layer by the etchant.

In an exemplary embodiment, the method may further include forming a second low reflective material layer on a second surface of the metal material layer opposite to the first surface, the second low reflective material layer including niobium carbide and zinc oxide. The second low reflective material layer may be integrally etched with the metal material layer and the first low reflective material layer by the etchant.

The conductive pattern according to the exemplary embodiments may include the first low reflective layer disposed on the first surface of the metal layer and including niobium carbide and zinc oxide, so that the reflectivity of the conductive pattern may decrease. Further, the display device according to the exemplary embodiments may include the conductive pattern, so that the reflectivity of the display device may decrease.

In the method of manufacturing the conductive pattern, the metal material layer and the first low reflective material layer may be integrally etched by the etchant, so that manufacturing cost and time of the conductive pattern may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
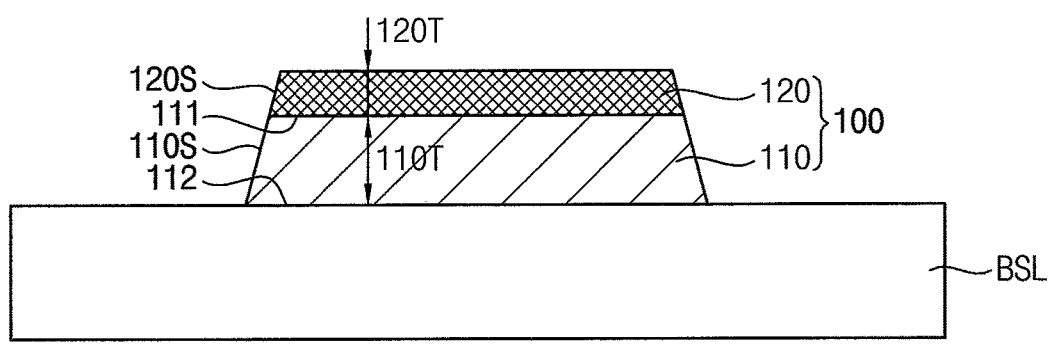
FIG. 1 is a cross-sectional view illustrating an exemplary embodiment of a conductive pattern.

Hereinafter, conductive patterns, methods of manufacturing conductive patterns, and display devices in accordance with embodiments will be explained in detail with reference to the accompanying drawings.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a cross-sectional view illustrating a conductive pattern.

Referring to FIG. 1, a conductive pattern 100 may be disposed on a base layer BSL. The base layer BSL may provide a space on which the conductive pattern 100 is disposed, and may include various materials for supporting the conductive pattern 100. In an exemplary embodiment, the base layer BSL may be an inorganic insulation substrate including an inorganic material such as glass or quartz, or an organic insulation substrate including an organic material such as polyimide PI. In another exemplary embodiment, the base layer BSL may be an inorganic insulation layer including an inorganic material such as silicon oxide, silicon nitride, or silicon oxynitride, or may be an organic insulation layer including an organic material. In another exemplary embodiment, the base layer BSL may be a semiconductor layer including a semiconductor material such as amorphous silicon, polysilicon, or an oxide semiconductor, or a conductive layer including a conductive material such as metal.

The conductive pattern 100 may have conductivity, and may have a specific planar shape. The conductive pattern 100 may be used in various electronic devices. In an exemplary embodiment, the conductive pattern 100 may be used in a display device such as an liquid crystal display device or an organic light emitting display device, for example. The conductive pattern 100 may be used as an electrode, a floating electrode, or the like, as well as a wiring for transmitting an electrical signal. In an exemplary embodiment, the conductive pattern 100 may be used as a gate line, a data line, a power supplying line, a voltage supplying line, or the like, and may be used a gate electrode, a source electrode, or a drain electrode of a transistor included in the display device, for example. Further, the conductive pattern 100 may be used as a sensing electrode of an input sensing unit included in the display device. Moreover, the conductive pattern 100 may be used as a light blocking pattern of the display device.

The conductive pattern 100 may include a metal layer 110 and a first low reflective layer 120 disposed on the metal layer 110.

The metal layer 110 may provide electrical conductivity to the conductive pattern 100. The metal layer 110 may include a metal. In an exemplary embodiment, the metal layer 110 may include at least one of copper (Cu), aluminum (Al), titanium (Ti), and molybdenum (Mo), for example. Since the metal layer 110 includes or consists of the metal, an electrical resistance of the metal layer 110 may be less than an electrical resistance of the first low reflective layer 120. The metal layer 110 may have a single-layer structure or a multilayer structure.

The first low reflective layer 120 may be disposed on a first surface 111 of the metal layer 110. The metal layer 110 may include the first surface 111 and a second surface 112 opposite to each other, and the first low reflective layer 120 may be disposed on the first surface 111 of the metal layer 110. In an exemplary embodiment, the first surface 111 and the second surface 112 of the metal layer 110 may be an upper surface and a lower surface of the metal layer 110, respectively. In such an exemplary embodiment, the metal layer 110 may be disposed on the base layer BSL, and the first low reflective layer 120 may be disposed on the metal layer 110. In an exemplary embodiment, the first surface 111 of the metal layer 110 may contact a lower surface of the first low reflective layer 120, and the second surface 112 of the metal layer 110 may contact an upper surface of the base layer BSL, for example.

The first low reflective layer 120 may cover the first surface 111 of the metal layer 110 thereby decreasing reflectivity of external light reflected by the first surface 111 of the metal layer 110. In an exemplary embodiment, the first low reflective layer 120 may cover the upper surface of the metal layer 110 thereby decreasing or substantially preventing external light incident onto the upper surface of the metal layer 110 from being reflected by the upper surface of the metal layer 110, for example. Since the metal layer 110 includes the metal, the metal layer 110 may have a relatively high reflectivity. When the first low reflective layer 120 is not disposed on the first surface 111 of the metal layer 110, the external light incident into the display device including the conductive pattern may be reflected by the first surface 111 of the metal layer 110. In this case, reflectivity of external light of the display device may increase, therefore, visibility of an image which the display device displays may be degraded. The first low reflective layer 120 may serve to decrease reflectivity of the external light by the conductive pattern 100.

In an exemplary embodiment, the first low reflective layer 120 may include niobium carbide (NbC) and zinc oxide (ZnO).

Niobium carbide may have a relatively low reflectivity. Accordingly, niobium carbide may have a low reflective property. Niobium carbide included in the first low reflective layer 120 may serve to decrease reflectivity of the first low reflective layer 120.

Zinc oxide may increase an etch rate of the first low reflective layer 120 in the process of forming the first low reflective layer 120. When the first low reflective layer 120 does not include zinc oxide, the first low reflective layer 120 may not be etched, or the etch rate of the first low reflective layer 120 may be less than an etch rate of the metal layer 110, therefore, the conductive pattern 100 may not have a uniform sidewall profile. The first low reflective layer 120 may include zinc oxide, so that the etch rate of the metal layer 110 may be substantially equal to the etch rate of the first low reflective layer 120.

In an exemplary embodiment, the amount of zinc oxide included in the first low reflective layer 120 may be less than or equal to about 50 atomic percent (at. %). In other words, a ratio of the amount of atoms of zinc oxide to the amount of atoms of total materials included in the first low reflective layer 120 may be less than or equal to about 50%. When the amount of zinc oxide included in the first low reflective layer 120 is greater than about 50 at. %, the etch rate of the first low reflective layer 120 may excessively increase, therefore, the conductive pattern 100 may not have a uniform sidewall profile. In this regard, the amount of zinc oxide included in the first low reflective layer 120 may be less than or equal to about 50 at. %, so that the etch rate of the metal layer 110 may be substantially equal to the etch rate of the first low reflective layer 120.

The first low reflective layer 120 may further include a relatively small amount of impurities. In an exemplary embodiment, the first low reflective layer 120 may include a metal as the impurities. In an exemplary embodiment, the first low reflective layer 120 may include aluminum (Al) as the impurities, for example. The metal may serve to stabilize plasma discharge in the process of depositing the first low reflective layer 120 using sputtering or the like.

In an exemplary embodiment, the amount of metal included in the first low reflective layer 120 may be less than or equal to about 5 mass percent (wt. %). In other words, a ratio of the mass of the metal to the mass of total materials included in the first low reflective layer 120 may be less than or equal to about 5%. In this case, a ratio of the mass of niobium carbide and zinc oxide to the mass of total materials included in the first low reflective layer 120 may be greater than about 95%.

In an exemplary embodiment, a width of a lower surface of the first low reflective layer 120 may be substantially equal to a width of an upper surface of the metal layer 110. In this case, the first surface 111 of the metal layer 110 may be substantially entirely covered by the first low reflective layer 120, therefore, the reflection of the external light by the first surface 111 of the metal layer 110 may be prevented.

In an exemplary embodiment, a sidewall 120S of the first low reflective layer 120 may contact a sidewall 110S of the metal layer 110. In other words, the sidewall 120S of the first low reflective layer 120 may not be protruded from or be recessed into the sidewall 110S of the metal layer 110 in a side direction. When the sidewall 120S of the first low reflective layer 120 is protruded than the sidewall 110S of the metal layer 110 in the side direction, an insulation layer covering the conductive pattern 100 may be damaged by a protruding portion of the first low reflective layer 120. When the sidewall 120S of the first low reflective layer 120 is recessed into the sidewall 110S of the metal layer 110 in the side direction, a portion of the first surface 111 of the metal layer 110 may be exposed so that reflectivity of the conductive pattern 100 may increase. The sidewall 120S of the first low reflective layer 120 may contact the sidewall 110S of the metal layer 110, so that the conductive pattern 100 may have a uniform sidewall profile.

In an exemplary embodiment, a thickness 120T of the first low reflective layer 120 may be less than a thickness 110T of the metal layer 110. When the thickness 120T of the first low reflective layer 120 is relatively large, the magnitude of a step structure by the conductive pattern 100 may increase, therefore, an upper surface profile of an insulation layer that covers the conductive pattern 100 may be degraded. Although the thickness 120T of the first low reflective layer 120 is less than the thickness 110T of the metal layer 110, the reflectivity of the first low reflective layer 120 may be kept constant when the thickness 120T of the first low reflective layer 120 is greater than a predetermined magnitude.

Figure 2:
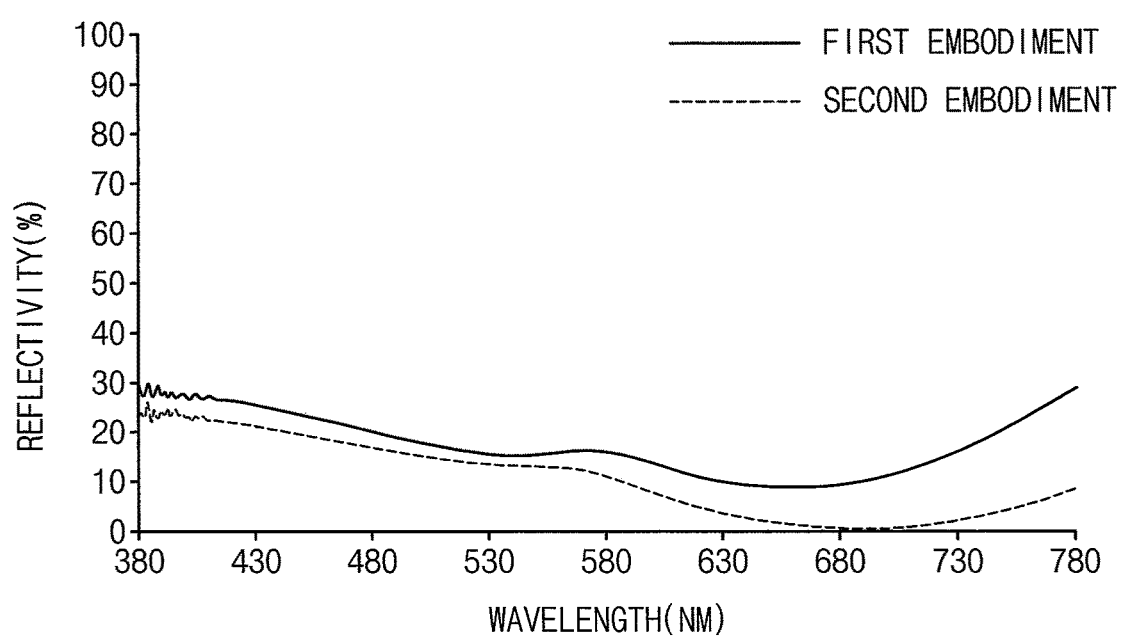
FIG. 2 is a graph illustrating an exemplary embodiment of a reflectivity of a conductive pattern.

FIG. 2 is a graph illustrating an exemplary embodiment of a reflectivity of a conductive pattern. FIG. 2 illustrates reflectivity of a conductive pattern including a metal layer including copper (Cu) and a low reflective layer including niobium carbide (NbC) and zinc oxide (ZnO) against visible light having a wavelength of about 380 nanometers (nm) to about 780 nm.

TABLE 1

| | FIRST EMBODIMENT | SECOND EMBODIMENT |
|---|---|---|
| 450 nm | 23.29% | 19.29% |
| 550 nm | 15.26% | 12.85% |
| 650 nm | 8.88% | 2.04% |
| AVERAGE | 17.38% | 10.54% |

Table 1 illustrates reflectivity of a conductive pattern including a metal layer including copper and a low reflective layer including niobium carbide and zinc oxide against visible light having a wavelength of about 450 nm, about 550 nm, and about 650 nm. The conductive pattern according to a first embodiment in FIG. 2 and Table 1 may include a first low reflective layer including niobium carbide of about 55 wt. % and zinc oxide of about 40 wt. %. The conductive pattern according to a second embodiment in FIG. 2 and Table 1 may include a first low reflective layer including niobium carbide of about 50 wt. % and zinc oxide of about 45 wt. %.

Referring to FIG. 2, the reflectivity of the conductive pattern against the visible light having the wavelength of about 380 nm to about 780 nm may be less or equal to about 30%. Further, referring to Table 1, the average reflectivity of the conductive pattern against the visible light may be less or equal to about 20%. In comparative examples according to the prior art, the average reflectivity of a conductive pattern having a single-layer structure including a molybdenum (Mo) layer may be from about 60% to about 70%, the average reflectivity of a conductive pattern having a multi-layer structure including a titanium (Ti) layer, an aluminum (Al) layer, and a titanium (Ti) layer may be from about 60% to about 70%, and the average reflectivity of a conductive pattern having a multilayer structure including a titanium (Ti) layer and a copper (Cu) layer may be from about 80% to about 90%. However, in the exemplary embodiments according to the invention, the average reflectivity of the conductive pattern including the metal layer and the first low reflective layer may be less than or equal to about 20%. Therefore, the reflectivity of the display device including the conductive pattern may decrease.

Figure 3:
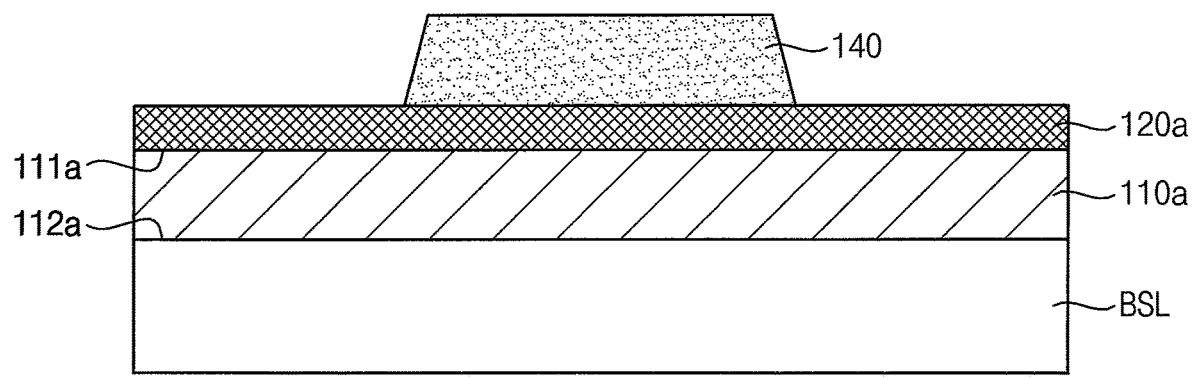
FIGS. 3 and 4 are cross-sectional views illustrating an exemplary embodiment of a method of manufacturing a conductive pattern.
Figure 4:
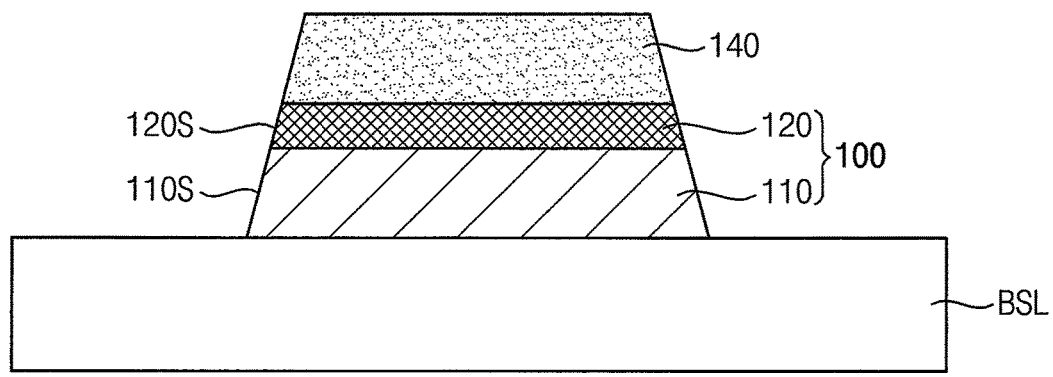

FIGS. 3 and 4 are cross-sectional views illustrating an exemplary embodiment of a method of manufacturing a conductive pattern. FIGS. 3 and 4 may illustrate a method of manufacturing the conductive pattern 100 illustrated in FIG. 1.

Referring to FIG. 3, a metal material layer 110a and a first low reflective material layer 120a may be sequentially disposed on the base layer BSL, and a photoresist pattern 140 may be disposed on the first low reflective material layer 120a.

First, the metal material layer 110a may be disposed on the base layer BSL such that the base layer BSL may be disposed on the lower surface 112a of the metal material layer 110a. A metal including at least one of copper (Cu), aluminum (Al), titanium (Ti), and molybdenum (Mo) may be deposited on the base layer BSL by sputtering to form the metal material layer 110a on the base layer BSL.

Then, the first low reflective material layer 120a may be disposed on the metal material layer 110a. Niobium (NbC), zinc oxide (ZnO), and a small amount of impurities may be deposited on a first surface 111a of the metal material layer 110a by sputtering to form the first low reflective material layer 120a on the metal material layer 110a.

In an exemplary embodiment, impurities used in the formation of the first low reflective material layer 120a may be a metal such as aluminum (Al), or the like. In an exemplary embodiment, the metal may serve to stabilize plasma discharge in the process of depositing the first low reflective material layer 120a using sputtering, or the like.

Then, the photoresist pattern 140 may be disposed on the first low reflective material layer 120a.

Referring to FIG. 4, the first low reflective material layer 120a (refer to FIG. 3) and the metal material layer 110a (refer to FIG. 3) may be etched using the photoresist pattern 140 as an etching mask to form the conductive pattern 100 including the metal layer 110 and the first low reflective layer 120.

The first low reflective material layer 120a and the metal material layer 110a may be etched by a wet etching. The first low reflective material layer 120a and the metal material layer 110a may be integrally etched by an etchant. In other words, the first low reflective material layer 120a and the metal material layer 110a may not be separately etched, and may be etched by single etching process using single etchant.

In an exemplary embodiment, the metal material layer 110a may include a metal such as Cu, Al, Ti, Mo, or the like, and the metal may be etched by a wet etching. Since niobium carbide included in the first low reflective material layer 120a is not wet-etched, when the first low reflective material layer 120a only includes niobium carbide, the first low reflective material layer 120a may not be wet-etched together with the metal material layer 110a. However, in the illustrated exemplary embodiment, the first low reflective material layer 120a may include zinc oxide that may be wet-etched together with the niobium carbide, therefore, the first low reflective material layer 120a may be etched together with the metal material layer 110a. Accordingly, the first low reflective material layer 120a and the metal material layer 110a may be etched by single etching process using single etchant, so that manufacturing cost and time of the conductive pattern 100 may be reduced.

In an exemplary embodiment, the amount of zinc oxide included in the first low reflective material layer 120a may be less than or equal to about 50 at. %. When the amount of zinc oxide included in the first low reflective material layer 120a is greater than about 50 at. %, an etch rate of the first low reflective material layer 120a may excessively increase. In this case, the etch rate of the first low reflective material layer 120a may be even greater than an etch rate of the metal material layer 110a, so that the first low reflective material layer 120a may not be etched together with the metal material layer 110a.

Figure 5:
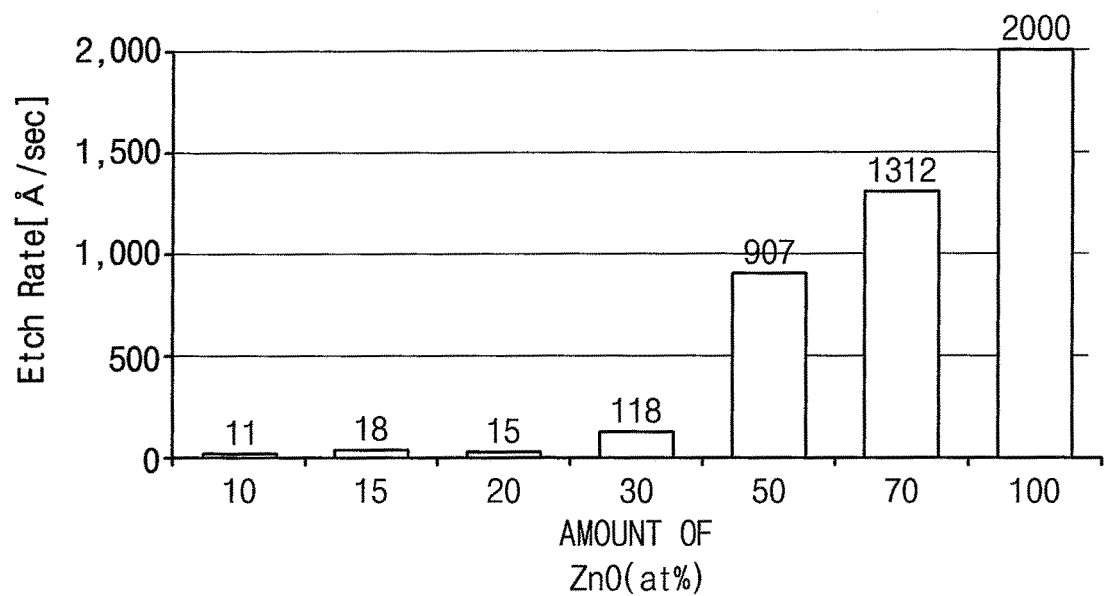
FIG. 5 is a graph illustrating an etch rate of a first low reflective material layer according to an amount of zinc oxide included in the first low reflective material layer.

FIG. 5 is a graph illustrating an etch rate of the first low reflective material layer 120a according to an amount of zinc oxide included in the first low reflective material layer 120a.

Referring to FIG. 5, when the amount of zinc oxide (ZnO) included in the first low reflective material layer 120a increases, the etch rate of the first low reflective material layer 120a may increase. In other words, the amount of zinc oxide included in the first low reflective material layer 120a may be directly proportional to the etch rate of the first low reflective material layer 120a.

The metal material layer 110a may include Cu, Al, Ti, Mo, or the like, an etch rate of Cu may be from about 150 angstroms per second (Å/sec) to about 250 Å/sec, an etch rate of Al may be from about 30 Å/sec to about 40 Å/sec, an etch rate of Ti may be from about 140 Å/sec to about 150 Å/sec, and an etch rate of Mo may be from about 150 Å/sec to about 200 Å/sec. When the amount of zinc oxide included in the first low reflective material layer 120a is greater than about 50 at. %, the etch rate of the first low reflective material layer 120a may be greater than about 907 Å/sec. Accordingly, a conductive pattern having a non-uniform sidewall profile may be provided because the amount of etching of the first low reflective material layer 120a is greater than the amount of etching of the metal material layer 110a.

However, in the illustrated exemplary embodiment, because the amount of zinc oxide included in the first low reflective material layer 120a is less than or equal to about 50 at. %, the amount of zinc oxide included in the first low reflective material layer 120a may be controlled such that the etch rate of the first low reflective material layer 120a may be substantially equal to the etch rate of the metal material layer 110a. Accordingly, the conductive pattern 100 having a uniform sidewall profile may be provided.

Figure 6:
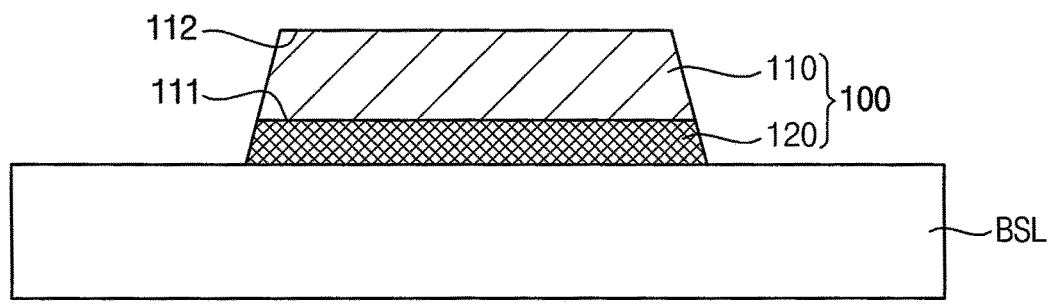
FIG. 6 is a cross-sectional view illustrating an exemplary embodiment of a conductive pattern.

FIG. 6 is a cross-sectional view illustrating an exemplary embodiment of a conductive pattern. The conductive pattern described with reference to FIG. 6 may be substantially the same as the conductive pattern described with reference to FIG. 1 except for the location of the first low reflective layer 120. Accordingly, descriptions on element of the conductive pattern described with reference to FIG. 6, which are substantially the same as or similar to those of the conductive pattern described with reference to FIG. 1, will not be repeated.

Referring to FIG. 6, the first low reflective layer 120 may be disposed on a first surface 111 of the metal layer 110. The metal layer 110 may include the first surface 111 and a second surface 112 opposite to each other, and the first low reflective layer 120 may be disposed on the first surface 111 of the metal layer 110. In an exemplary embodiment, the first surface 111 and the second surface 112 of the metal layer 110 may be a lower surface and an upper surface of the metal layer 110, respectively. In such an exemplary embodiment, the first low reflective layer 120 may be disposed on the base layer BSL, and the metal layer 110 may be disposed on the first low reflective layer 120. In an exemplary embodiment, the first surface 111 of the metal layer 110 may contact an upper surface of the first low reflective layer 120, for example.

The first low reflective layer 120 may cover the first surface 111 of the metal layer 110 thereby decreasing reflectivity of external light reflected by the first surface 111 of the metal layer 110. In an exemplary embodiment, the first low reflective layer 120 may cover the lower surface of the metal layer 110 thereby decreasing or substantially preventing external light incident onto the lower surface of the metal layer 110 from being reflected by the lower surface of the metal layer 110, for example.

Figure 7:
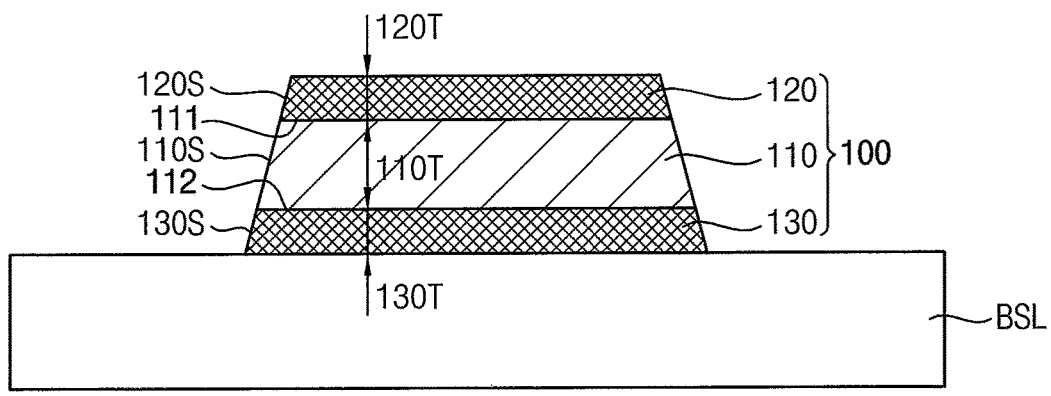
FIG. 7 is a cross-sectional view illustrating an exemplary embodiment of a conductive pattern.

FIG. 7 is a cross-sectional view illustrating an exemplary embodiment of a conductive pattern. The conductive pattern described with reference to FIG. 7 may be substantially the same as the conductive pattern described with reference to FIG. 1 except for the addition of a second low reflective layer 130. Accordingly, descriptions on elements of the conductive pattern described with reference to FIG. 7, which are substantially the same as or similar to those of the conductive pattern described with reference to FIG. 1, will not be repeated.

Referring to FIG. 7, the conductive pattern 100 may include a second low reflective layer 130, a metal layer 110 disposed on the second low reflective layer 130, and a first low reflective layer 120 disposed on the metal layer 110.

The second low reflective layer 130 may be disposed on a second surface 112 of the metal layer 110. The first low reflective layer 120 may be disposed on a first surface 111 of the metal layer 110, and the second low reflective layer 130 may be disposed on the second surface 112 of the metal layer 110. In an exemplary embodiment, the first surface 111 and the second surface 112 of the metal layer 110 may be an upper surface and a lower surface of the metal layer 110, respectively. In such an exemplary embodiment, the second low reflective layer 130 may be disposed on the base layer BSL, the metal layer 110 may be disposed on the second low reflective layer 130, and the first low reflective layer 120 may be disposed on the metal layer 110. In an exemplary embodiment, the first surface 111 of the metal layer 110 may contact a lower surface of the first low reflective layer 120, and the second surface 112 of the metal layer 110 may contact an upper surface of the second low reflective layer 130, for example.

The second low reflective layer 130 may cover the second surface 112 of the metal layer 110 thereby decreasing reflectivity of external light reflected by the second surface 112 of the metal layer 110. In an exemplary embodiment, the second low reflective layer 130 may cover the lower surface of the metal layer 110 thereby decreasing or substantially preventing external light incident onto the lower surface of the metal layer 110 from being reflected by the lower surface of the metal layer 110, for example. When the second low reflective layer 130 is not disposed on the second surface 112 of the metal layer 110, the external light incident into the display device including the conductive pattern may be reflected by the second surface 112 of the metal layer 110. The second low reflective layer 130 may serve to decrease reflectivity of the external light by the conductive pattern 100.

The second low reflective layer 130 may include niobium carbide (NbC) and zinc oxide (ZnO). Niobium carbide included in the second low reflective layer 130 may serve to decrease reflectivity of the second low reflective layer 130. Zinc oxide may increase an etch rate of the second low reflective layer 130 in the process of forming the second low reflective layer 130.

In an exemplary embodiment, the amount of zinc oxide included in the second low reflective layer 130 may be substantially equal to the amount of zinc oxide included in the first low reflective layer 120. When the amount of zinc oxide included in the second low reflective layer 130 is different from the amount of zinc oxide included in the first low reflective layer 120, the etch rate of the second low reflective layer 130 may be different from the etch rate of the first low reflective layer 120, therefore, the conductive pattern 100 may not have a uniform sidewall profile. The amount of zinc oxide included in the second low reflective layer 130 may be substantially equal to the amount of zinc oxide included in the first low reflective layer 120, so that the etch rate of the second low reflective layer 130 may be substantially equal to the etch rate of the first low reflective layer 120.

The second low reflective layer 130 may further include a relatively small amount of impurities. In an exemplary embodiment, the second low reflective layer 130 may include a metal as the impurities. In an exemplary embodiment, the second low reflective layer 130 may include aluminum (Al) as the impurities, for example. The metal may serve to stabilize plasma discharge in the process of depositing the second low reflective layer 130 using sputtering or the like. In an exemplary embodiment, the amount of metal included in the second low reflective layer 130 may be less than or equal to about 5 wt. %.

In an exemplary embodiment, a width of an upper surface of the second low reflective layer 130 may be substantially equal to a width of a lower surface of the metal layer 110. In this case, the second surface 112 of the metal layer 110 may be substantially entirely covered by the second low reflective layer 130, therefore, the reflection of the external light by the second surface 112 of the metal layer 110 may be prevented.

In an exemplary embodiment, a sidewall 120S of the first low reflective layer 120 and a sidewall 130S of the second low reflective layer 130 may contact a sidewall 110S of the metal layer 110. In other words, the sidewall 120S of the first low reflective layer 120 and the sidewall 130S of the second low reflective layer 130 may not be protruded from or be recessed into the sidewall 110S of the metal layer 110 in a side direction. When the sidewall 130S of the second low reflective layer 130 is recessed into the sidewall 110S of the metal layer 110 in the side direction, a portion of the second surface 112 of the metal layer 110 may be exposed so that reflectivity of the conductive pattern 100 may increase. The sidewall 120S of the first low reflective layer 120 and the sidewall 130S of the second low reflective layer 130 may contact the sidewall 110S of the metal layer 110, so that the conductive pattern 100 may have a uniform sidewall profile.

In an exemplary embodiment, a thickness 130T of the second low reflective layer 130 may be less than a thickness 110T of the metal layer 110. When the thickness 130T of the second low reflective layer 130 is relatively large, the magnitude of a step structure by the conductive pattern 100 may increase, therefore, an upper surface profile of an insulation layer that covers the conductive pattern 100 may be degraded.

Figure 8:
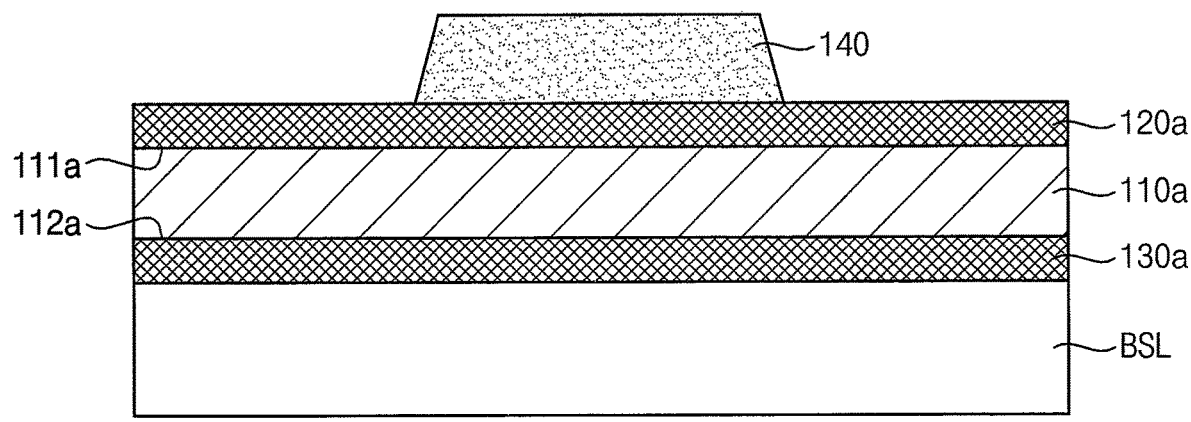
FIGS. 8 and 9 are cross-sectional views illustrating an exemplary embodiment of a method of manufacturing a conductive pattern.
Figure 9:
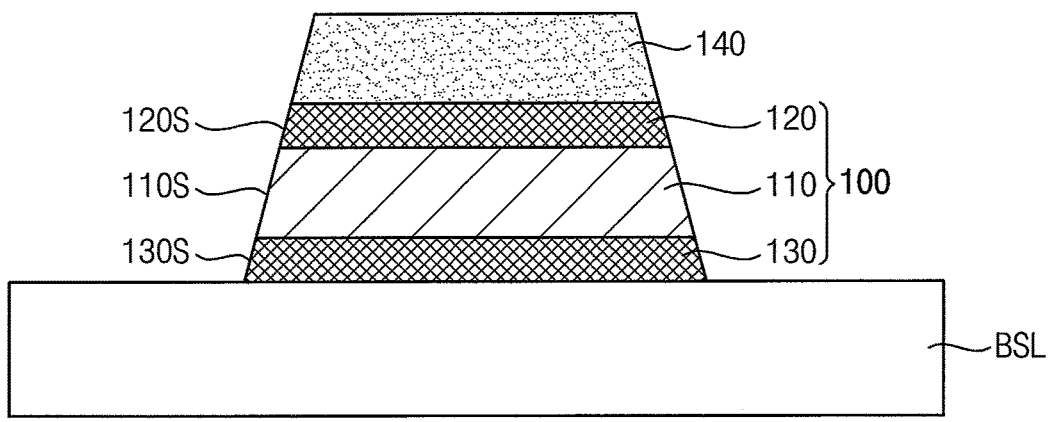

FIGS. 8 and 9 are cross-sectional views illustrating an exemplary embodiment of a method of manufacturing a conductive pattern. FIGS. 8 and 9 may illustrate a method of manufacturing the conductive pattern 100 illustrated in FIG. 7. Descriptions on elements of the method of manufacturing the conductive pattern described with reference to FIGS. 8 and 9, which are substantially the same as or similar to those of the method of manufacturing the conductive pattern described with reference to FIGS. 3 and 4, will not be repeated.

Referring to FIG. 8, a second low reflective material layer 130a, a metal material layer 110a, and a first low reflective material layer 120a may be sequentially disposed on the base layer BSL, and a photoresist pattern 140 may be disposed on the first low reflective material layer 120a.

First, the second low reflective material layer 130a may be disposed on the base layer BSL. Niobium (NbC), zinc oxide (ZnO), and a small amount of impurities may be deposited on the base layer BSL by sputtering to form the second low reflective material layer 130a on the base layer BSL.

In an exemplary embodiment, impurities used in the formation of the second low reflective material layer 130a may be a metal such as aluminum (Al), or the like. The metal may serve to stabilize plasma discharge in the process of depositing the second low reflective material layer 130a using sputtering, or the like.

Then, the metal material layer 110a may be disposed on the second low reflective material layer 130a, and the first low reflective material layer 120a may be disposed on the metal material layer 110a. Then, the photoresist pattern 140 may be disposed on the first low reflective material layer 120a.

Referring to FIG. 9, the first low reflective material layer 120a (refer to FIG. 8), the metal material layer 110a (refer to FIG. 8), and the second low reflective material layer 130a (refer to FIG. 8) may be etched using the photoresist pattern 140 as an etching mask to form the conductive pattern 100 including the second low reflective layer 130, the metal layer 110, and the first low reflective layer 120.

The first low reflective material layer 120a, the metal material layer 110a, and the second low reflective material layer 130a may be etched by a wet etching. The first low reflective material layer 120a, the metal material layer 110a, and the second low reflective material layer 130a may be integrally etched by an etchant. In other words, the first low reflective material layer 120a, the metal material layer 110a, and the second low reflective material layer 130*a* may not be separately etched, and may be etched by single etching process using single etchant.

In an exemplary embodiment, the metal material layer 110*a* may include a metal such as Cu, Al, Ti, Mo, or the like, and the metal may be etched by a wet etching. Since niobium carbide included in each of the first low reflective material layer 120*a* and the second low reflective material layer 130*a* is not wet-etched, when each of the first low reflective material layer 120*a* and the second low reflective material layer 130*a* only includes niobium carbide, the first low reflective material layer 120*a* and the second low reflective material layer 130*a* may not be wet-etched together with the metal material layer 110*a*. However, in the illustrated exemplary embodiment, each of the first low reflective material layer 120*a* and the second low reflective material layer 130*a* may include zinc oxide that may be wet-etched together with the niobium carbide, therefore, the first low reflective material layer 120*a* and the second low reflective material layer 130*a* may be etched together with the metal material layer 110*a*. Accordingly, the first low reflective material layer 120*a*, the metal material layer 110*a*, and the second low reflective material layer 130*a* may be etched by single etching process using single etchant, so that manufacturing cost and time of the conductive pattern 100 may be reduced.

In an exemplary embodiment, the amount of zinc oxide included in the second low reflective material layer 130*a* may be less than or equal to about 50 at. %. Further, the amount of zinc oxide included in the second low reflective material layer 130*a* may be substantially equal to the amount of zinc oxide included in the first low reflective material layer 120*a*. In the illustrated exemplary embodiment, because the amount of zinc oxide included in the first low reflective material layer 120*a* and the amount of zinc oxide included in the second low reflective material layer 130*a* are less than or equal to about 50 at. % and substantially equal to each other, the amount of zinc oxide included in the first low reflective material layer 120*a* and the amount of zinc oxide included in the second low reflective material layer 130*a* may be controlled such that the etch rate of the first low reflective material layer 120*a*, the etch rate of the second low reflective material layer 130*a*, and the etch rate of the metal material layer 110*a* may be substantially equal. Accordingly, the conductive pattern 100 having a uniform sidewall profile may be provided.

Figure 10:
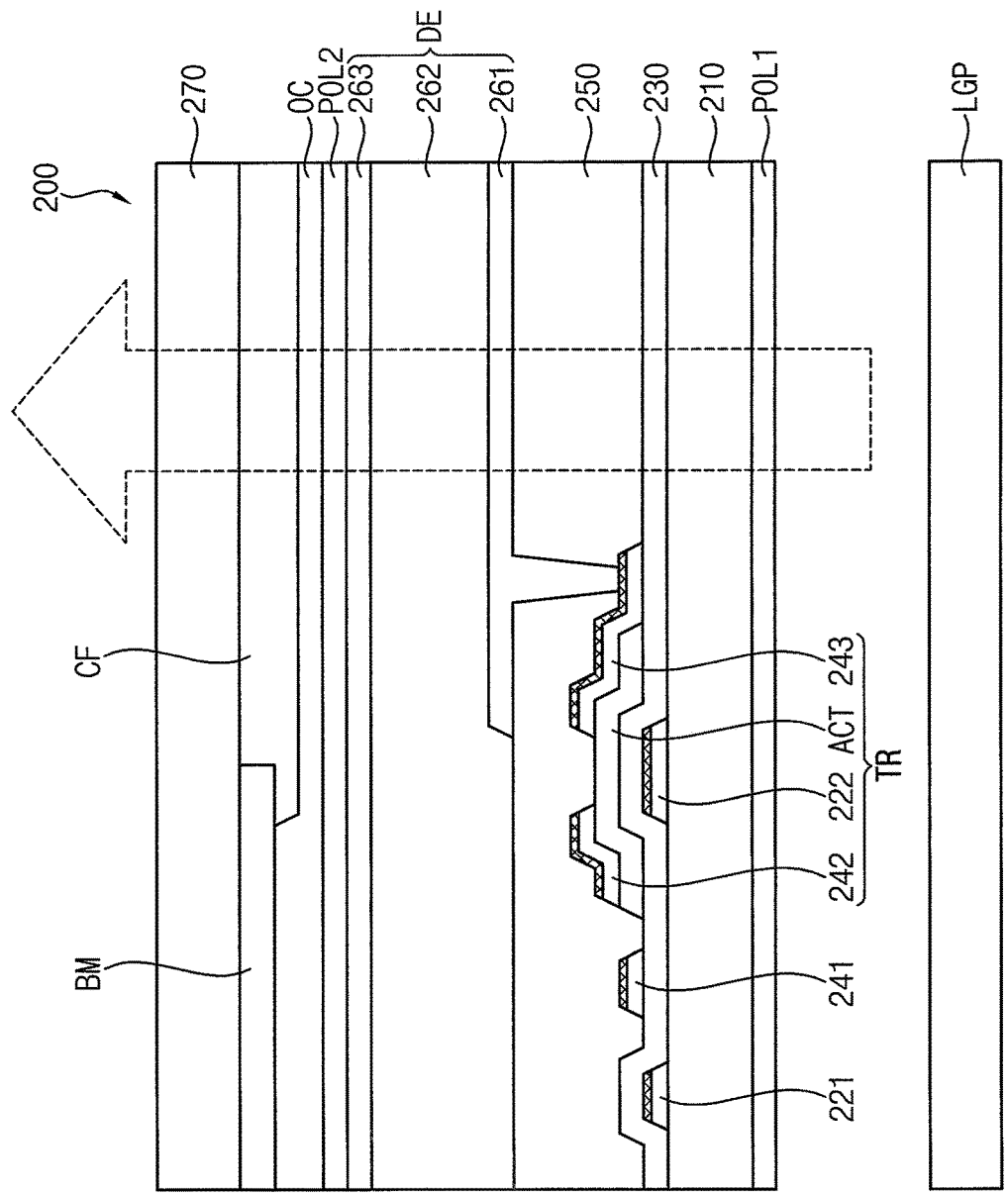
FIG. 10 is a cross-sectional view illustrating an exemplary embodiment of a display device.

FIG. 10 is a cross-sectional view illustrating an exemplary embodiment of a display device. The display device described with reference to FIG. 10 may be a liquid crystal display device including the conductive pattern 100 described above.

Referring to FIG. 10, a liquid crystal display device 200 may include a light guide plate LGP, a first polarizer POL1, a substrate 210, a first conductive layer, a gate insulation layer 230, an active layer ACT, a second conductive layer, a passivation layer 250, a first electrode 261, a liquid crystal layer 262, a second electrode 263, a second polarizer POL2, an overcoat layer OC, a color filter CF, a black matrix BM, and an encapsulation layer 270. Each of the above-mentioned elements may have a single layer structure or a multilayer structure.

Other elements may be further disposed between the above-mentioned elements.

The substrate 210 may include or consist of an insulation material. In an exemplary embodiment, the substrate 210 may include or consist of an inorganic material such as glass, quartz or the like, or an organic material such as polyimide or the like. The substrate 210 may be a rigid substrate or a flexible substrate.

The light guide plate LGP may be disposed under the substrate 210. The light guide plate LGP may guide light generated from a light source toward the substrate 210.

The first polarizer POL1 may be disposed on a lower surface of the substrate 210. The polarizer POL1 may be a coated polarizer, a wire grid polarizer, or the like.

The first conductive layer may be disposed on the substrate 210. The first conductive layer may include a gate line 221 and a gate electrode 222 of a transistor TR. The gate line 221 may transmit a gate signal to the gate electrode 222.

The above-mentioned conductive pattern may be applied to the first conductive layer. In other words, the first conductive layer may include a metal layer and a first low reflective layer disposed on a first surface of the metal layer and including niobium carbide and zinc oxide. In an exemplary embodiment, the metal layer of the conductive pattern may be disposed between the substrate 210 and the first low reflective layer of the conductive pattern as illustrated in FIG. 10. In other words, the first low reflective layer may be disposed on an upper surface of the metal layer. In this case, reflection of the external light, which is incident onto a front surface (e.g., a display surface) of the liquid crystal display device 200 and reflected by the conductive pattern, may be decreased or substantially prevented, therefore, reflectivity of external light on the front surface of the liquid crystal display device 200 may decrease.

The gate insulation layer 230 may be disposed on the first conductive layer. In an exemplary embodiment, the gate insulation layer 230 may include or consist of an inorganic insulation material such as silicon nitride, silicon oxide, or the like.

The active layer ACT and the second conductive layer may be disposed on the gate insulation layer 230. The active layer ACT may overlap the gate electrode 222. The active layer ACT may include or consist of amorphous silicon, polysilicon, an oxide semiconductor, or the like. The second conductive layer may include a data line 241, a source electrode 242 and a drain electrode 243 of the transistor TR. The data line 241 may transmit a data signal to the source electrode 242. The source electrode 242 and the drain electrode 243 may be connected to the active layer ACT. The gate electrode 222, the active layer ACT, the source electrode 242, and the drain electrode 243 may form the transistor TR.

The above-mentioned conductive pattern may be applied to the second conductive layer. In other words, the second conductive layer may include a metal layer and a first low reflective layer disposed on a first surface of the metal layer and including niobium carbide and zinc oxide.

The passivation layer 250 may be disposed on the second conductive layer. In an exemplary embodiment, the passivation layer 250 may include or consist of an inorganic insulation material such as silicon nitride, silicon oxide, or the like and/or an organic insulation material such as polyimide or the like.

The first electrode 261 may be disposed on the passivation layer 250. The first electrode 261 may be connected to the drain electrode 243. The second electrode 263 may be disposed on the first electrode 261. Each of the first electrode 261 and the second electrode 263 may include or consist of a transparent conductive material.

The liquid crystal layer 262 may be disposed between the first electrode 261 and the second electrode 263. The liquid crystal layer 262 may include liquid crystal molecules. The arranging direction of the liquid crystal molecules may be controlled by an electric field generated between the first electrode 261 and the second electrode 263. The liquid crystal layer 262 may control transmittance of light provided from the light guide plate LGP based on the electric field generated between the first electrode 261 and the second electrode 263, and may emit the light toward the encapsulation layer 270. The first electrode 261, the liquid crystal layer 262, and the second electrode 263 may form a display element DE.

The second polarizer POL2 may be disposed on the second electrode 263. The second polarizer POL2 may be a coated polarizer, a wire grid polarizer, or the like. The overcoat layer OC may be disposed on the second polarizer POL2.

The color filter CF may be disposed on the overcoat layer OC. The color filter CF may overlap the first electrode 261. The color filter CF may transfer a wavelength of light provided from the liquid crystal layer 262, and may emit the light toward the encapsulation layer 270.

The black matrix BM may be disposed on the overcoat layer OC. The black matrix BM may be adjacent to the color filter CF, and may partially overlap the color filter CF. The black matrix BM may block leakage of light.

The encapsulation layer 270 may be disposed on the color filter CF and the black matrix BM. The encapsulation layer may include or consist of an insulation material. In an exemplary embodiment, the encapsulation layer 270 may include or consist of an inorganic material such as glass, quartz, etc., or an organic material such as polyimide, etc. The encapsulation layer 270 may be a rigid substrate or a flexible substrate.

In the embodiment, the liquid crystal display device 200 may include the conductive pattern, so that reflectivity of external light on the display surface of the liquid crystal display device 200 may decrease. Accordingly, visibility of an image displayed from the liquid crystal display device 200 may be improved.

Figure 11:
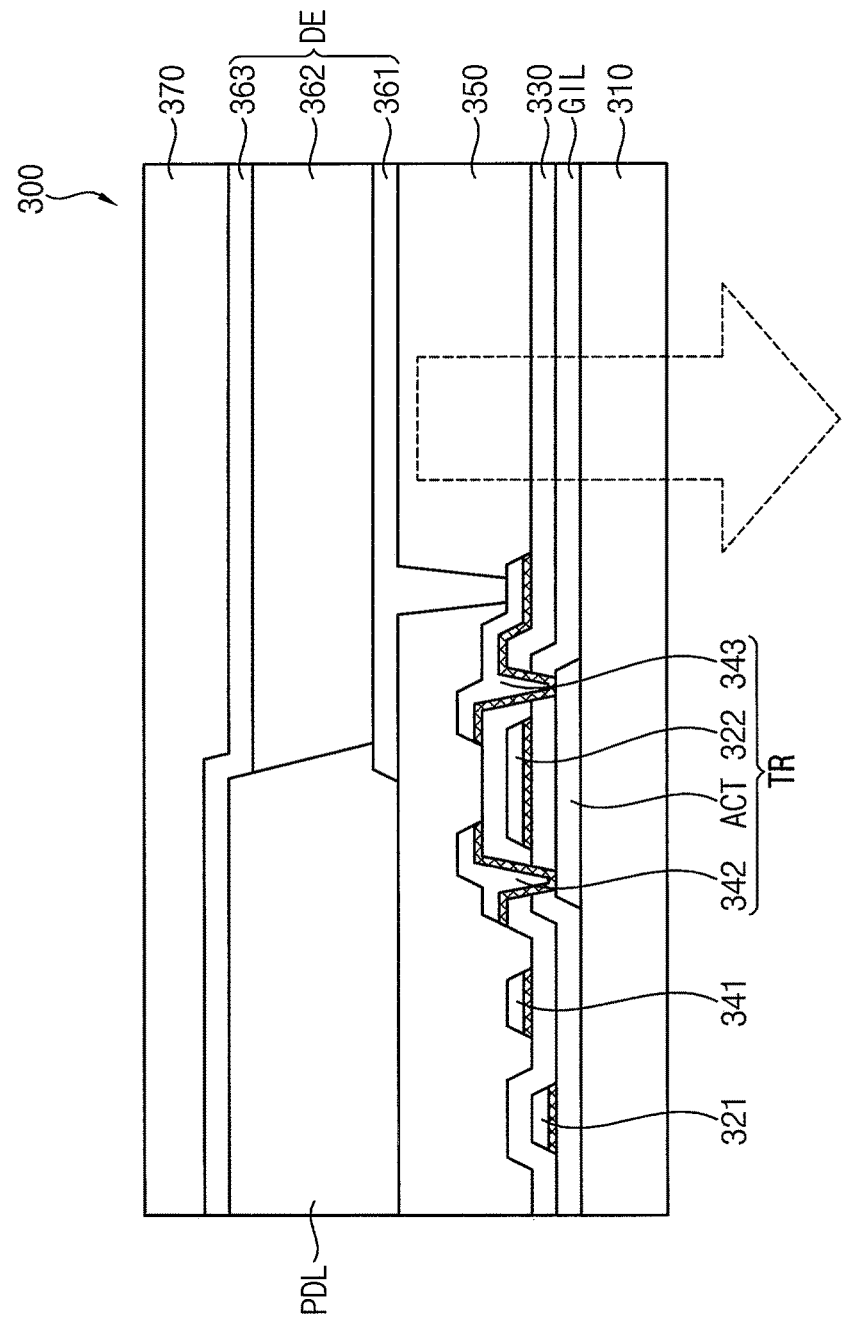
FIG. 11 is a cross-sectional view illustrating an exemplary embodiment of a display device.

FIG. 11 is a cross-sectional view illustrating an exemplary embodiment of a display device. The display device described with reference to FIG. 11 may be a bottom emission type organic light emitting display device including the conductive pattern 100 described above.

Referring to FIG. 11, a bottom emission type organic light emitting display device 300 may include a substrate 310, an active layer ACT, a gate insulation layer GIL, a first conductive layer, an insulation interlayer 330, a second conductive layer, a passivation layer 350, a first electrode 361, a pixel defining layer PDL, an emission layer 362, a second electrode 363, and an encapsulation layer 370. Each of the above-mentioned elements may have a single layer structure or a multilayer structure. Other elements may be further disposed between the above-mentioned elements.

The active layer ACT may be disposed on the substrate 310. The active layer ACT may include or consist of amorphous silicon, polysilicon, an oxide semiconductor, or the like.

The gate insulation layer GIL may be disposed on the active layer ACT. In an exemplary embodiment, the gate insulation layer GIL may include or consist of an inorganic insulation material such as silicon nitride, silicon oxide, or the like.

The first conductive layer may be disposed on the gate insulation layer GIL. The first conductive layer may include a gate line 321 and a gate electrode 322 of a transistor TR. The gate electrode 322 may overlap the active layer ACT.

The above-mentioned conductive pattern may be applied to the first conductive layer. In other words, the first conductive layer may include a metal layer and a first low reflective layer disposed on a first surface of the metal layer and including niobium carbide and zinc oxide. In an exemplary embodiment, the first low reflective layer of the conductive pattern may be disposed between the substrate 310 and the metal layer of the conductive pattern as illustrated in FIG. 11. In other words, the first low reflective layer may be disposed on a lower surface of the metal layer. In this case, reflection of the external light, which is incident onto a rear surface (e.g., a display surface) of the organic light emitting display device 300 and reflected by the conductive pattern, may be decreased or substantially prevented, therefore, reflectivity of external light on the rear surface of the organic light emitting display device 300 may decrease.

The insulation interlayer 330 may be disposed on the first conductive layer. In an exemplary embodiment, the insulation interlayer 330 may include or consist of an inorganic insulation material such as silicon nitride, silicon oxide, or the like.

The second conductive layer may be disposed on the insulation interlayer 330. The second conductive layer may include a data line 341, a source electrode 342 and a drain electrode 343 of the transistor TR. The active layer ACT, the gate electrode 322, the source electrode 342, and the drain electrode 343 may form the transistor TR.

The above-mentioned conductive pattern may be applied to the second conductive layer. In other words, the second conductive layer may include a metal layer and a first low reflective layer disposed on a first surface of the metal layer and including niobium carbide and zinc oxide.

The passivation layer 350 may be disposed on the second conductive layer. In an exemplary embodiment, the passivation layer 350 may include or consist of an inorganic insulation material such as silicon nitride, silicon oxide, or the like and/or an organic insulation material such as polyimide or the like.

The first electrode 361 may be disposed on the passivation layer 350. The pixel defining layer PDL may be disposed on the first electrode 361. A pixel opening that exposes at least a portion of the first electrode 361 may be defined in the pixel defining layer PDL. In an exemplary embodiment, the pixel defining layer PDL may include or consist of an inorganic insulation material and/or an organic insulation material such as polyimide or the like.

The emission layer 362 may be disposed in the pixel opening on the first electrode 361. The emission layer 362 may include a low molecular organic material or a polymer organic material. The second electrode 363 may be disposed on the emission layer 362 and the pixel defining layer PDL. The first electrode 361 may include or consist of a light-transmitting conductive material, and the second electrode 363 may include or consist of a reflective conductive material.

Luminance of light emitted from the emission layer 362 may be controlled by current between the first electrode 361 and the second electrode 363. The emission layer 362 may generate light based on the current between the first electrode 361 and the second electrode 363, and may emit the light toward the substrate 310. The first electrode 361, the emission layer 362, and the second electrode 363 may form a display element DE.

The encapsulation layer 370 may be disposed on the second electrode 363. The encapsulation layer 370 may include or consist of an insulation material. The encapsulation layer 370 may include at least one inorganic encapsulation layer and at least one organic encapsulation layer.

In the illustrated exemplary embodiment, the bottom emission type organic light emitting display device 300 may include the conductive pattern, so that reflectivity of external light on the display surface of the bottom emission type organic light emitting display device 300 may decrease. Accordingly, visibility of an image displayed from the bottom emission type organic light emitting display device 300 may be improved.

Figure 12:
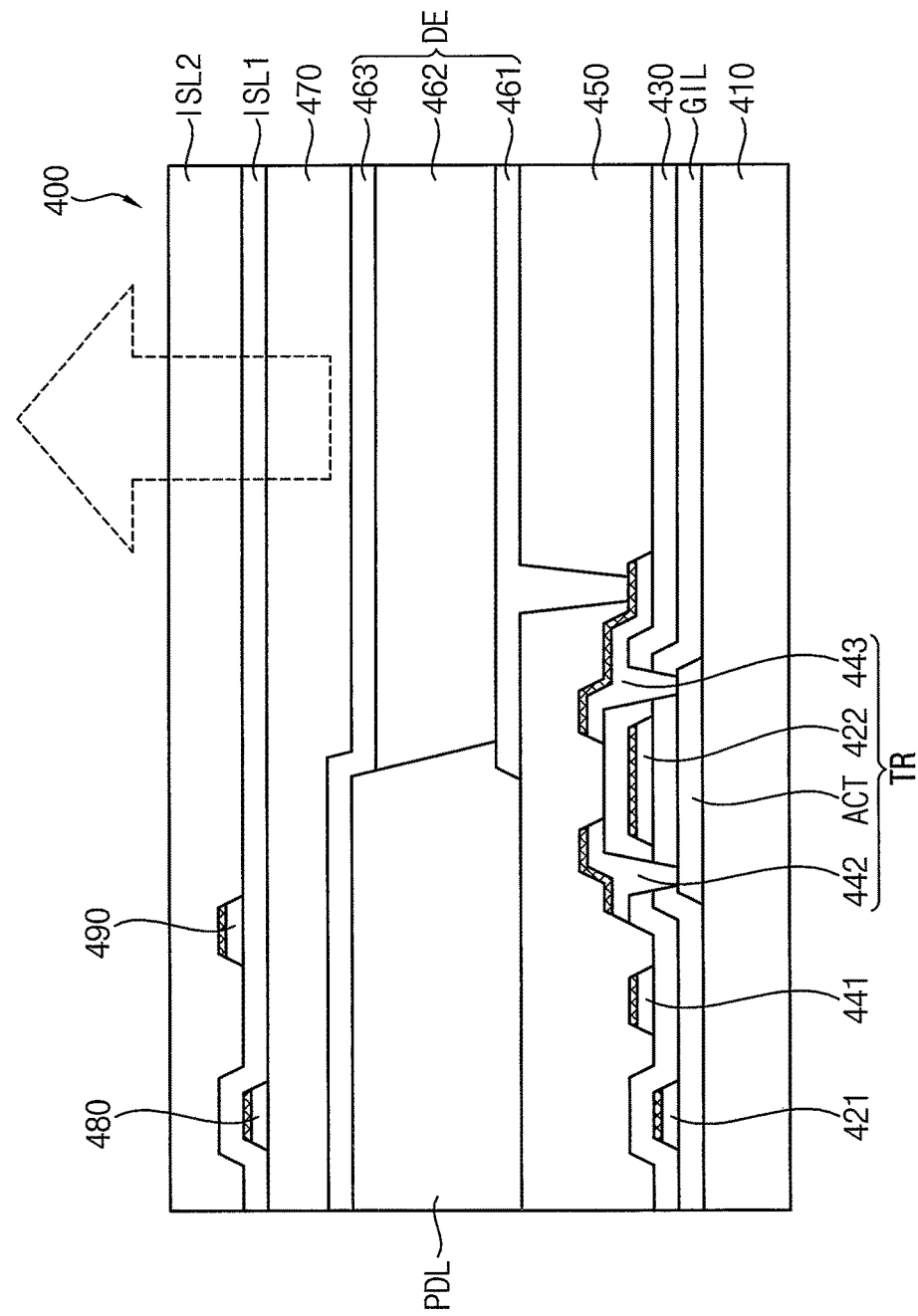
FIG. 12 is a cross-sectional view illustrating an exemplary embodiment of a display device.

FIG. 12 is a cross-sectional view illustrating an exemplary embodiment of a display device. The display device described with reference to FIG. 12 may be a top emission type organic light emitting display device including the conductive pattern 100 described above.

Description regarding elements of the top emission type organic light emitting display device described with reference to FIG. 12, which are substantially the same as or similar to those of the bottom emission type organic light emitting display device described with reference to FIG. 11, will not be repeated.

Referring to FIG. 12, a top emission type organic light emitting display device 400 may include a substrate 410, an active layer ACT, a gate insulation layer GIL, a first conductive layer, an insulation interlayer 430, a second conductive layer, a passivation layer 450, a first electrode 461, a pixel defining layer PDL, an emission layer 462, a second electrode 463, an encapsulation layer 470, a first sensing electrode 480, a first insulation layer ISL1, a second sensing electrode 490, and a second insulation layer ISL2. The first conductive layer may include a gate line 421 and a gate electrode 422 of a transistor TR. The second conductive layer may include a data line 441, and a source electrode 442 and a drain electrode 443 of the transistor TR. Each of the above-mentioned elements may have a single layer structure or a multilayer structure. Other elements may be further disposed between the above-mentioned elements.

The above-mentioned conductive pattern may be applied to each of the first conductive layer and the second conductive layer. In other words, each of the first conductive layer and the second conductive layer may include a metal layer and a first low reflective layer disposed on a first surface of the metal layer and including niobium carbide and zinc oxide. In an exemplary embodiment, the metal layer of the conductive pattern may be disposed between the substrate 410 and the first low reflective layer of the conductive pattern as illustrated in FIG. 12. In other words, the first low reflective layer may be disposed on an upper surface of the metal layer. In this case, reflection of the external light, which is incident onto a front surface (e.g., a display surface) of the organic light emitting display device 400 and reflected by the conductive pattern, may be decreased or substantially prevented, therefore, reflectivity of external light on the front surface of the organic light emitting display device 400 may decrease.

The pixel defining layer PDL may be disposed on the first electrode 461, and a pixel opening that exposes at least a portion of the first electrode 461 may be defined in the pixel defining layer PD. The emission layer 462 may be disposed in the pixel opening on the first electrode 461, and the second electrode 463 may be disposed on the emission layer 462 and the pixel defining layer PDL. The first electrode 461 may include or consist of a reflective conductive material, and the second electrode 463 may include or consist of a light-transmitting conductive material, for example.

The first sensing electrode 480 may be disposed on the encapsulation layer 470. The first insulation layer ISL1 may be disposed on the first sensing electrode 480. In an exemplary embodiment, the first insulation layer ISL1 may include or consist of an inorganic insulation material such as silicon nitride, silicon oxide, or the like.

The second sensing electrode 490 may be disposed on the first insulation layer ISL1. The second insulation layer ISL2 may be disposed on the second sensing electrode 490. In an exemplary embodiment, the second insulation layer ISL2 may include or consist of an inorganic insulation material such as silicon nitride, silicon oxide, or the like and/or an organic insulation material such as polyimide or the like.

In an exemplary embodiment, the first sensing electrode 480 and the second sensing electrode 490 may sense an input from a user such as a finger of the user, an external object, etc. contacting or approaching the display surface of the organic light emitting display device 400. In an exemplary embodiment, the first sensing electrode 480 and the second sensing electrode 490 may sense the input from the user with a static capacitive manner, for example. In an exemplary embodiment, one of the first sensing electrode 480 and the second sensing electrode 490 may be a sensing electrode that outputs a sensing signal corresponding to the input of the user to a sensing driver, and the other of the first sensing electrode 480 and the second sensing electrode 490 may be a driving electrode that receives a driving signal from the sensing driver.

The above-mentioned conductive pattern may be applied to each of the first sensing electrode 480 and the second sensing electrode 490. In other words, each of the first sensing electrode 480 and the second sensing electrode 490 may include a metal layer and a first low reflective layer disposed on a first surface of the metal layer and including niobium carbide and zinc oxide.

The conductive pattern according to the exemplary embodiments may be applied to a wiring, an electrode, or the like of a display device included in a computer, a notebook, a mobile phone, a smartphone, a smart pad, a portable media player ("PMP"), a personal digital assistant ("PDA"), an MP3 player, or the like.

Although the conductive pattern, the display device, and the method of manufacturing the conductive pattern according to the exemplary embodiments have been described with reference to the drawings, the illustrated exemplary embodiments are examples, and may be modified and changed by a person having ordinary knowledge in the relevant technical field without departing from the technical spirit described in the following claims.

What is claimed is:

1. A conductive pattern, comprising:
   a metal layer; and
   a first low reflective layer disposed on a first surface of the metal layer, the first low reflective layer including niobium carbide (NbC) and zinc oxide (ZnO).

2. The conductive pattern of claim 1, wherein an amount of the zinc oxide included in the first low reflective layer is less than or equal to 50 atomic percent.

3. The conductive pattern of claim 1, wherein the first low reflective layer further includes a metal.

4. The conductive pattern of claim 3, wherein the metal includes aluminum (Al).

5. The conductive pattern of claim 3, wherein an amount of the metal included in the first low reflective layer is less than or equal to 5 mass percent.

6. The conductive pattern of claim 1, further comprising:
a second low reflective layer disposed on a second surface of the metal layer opposite to the first surface, the second low reflective layer including niobium carbide and zinc oxide.

7. The conductive pattern of claim 6, wherein an amount of the zinc oxide included in the second low reflective layer is equal to an amount of the zinc oxide included in the first low reflective layer.

8. The conductive pattern of claim 1, wherein a sidewall of the first low reflective layer contacts a sidewall of the metal layer.

9. The conductive pattern of claim 1, wherein a thickness of the first low reflective layer is less than a thickness of the metal layer.

10. The conductive pattern of claim 1, wherein the metal layer includes at least one of copper (Cu), aluminum (Al), titanium (Ti), and molybdenum (Mo).

11. A display device, comprising:
a substrate;
a transistor disposed on the substrate;
a display element disposed on the transistor;
an encapsulation layer covering the display element; and
a conductive pattern disposed between the substrate and the encapsulation layer or on the encapsulation layer, the conductive pattern including:
a metal layer; and
a first low reflective layer disposed on a first surface of the metal layer, the first low reflective layer including niobium carbide (NbC) and zinc oxide (ZnO).

12. The display device of claim 11, wherein the metal layer is disposed between the substrate and the first low reflective layer.

13. The display device of claim 11, wherein the first low reflective layer is disposed between the substrate and the metal layer.

14. The display device of claim 11, wherein the conductive pattern further includes a second low reflective layer disposed on a second surface of the metal layer opposite to the first surface, the second low reflective layer including niobium carbide and zinc oxide.

15. The display device of claim 11, wherein the conductive pattern is disposed between the substrate and the encapsulation layer, and is a gate line for transmitting a gate signal to the transistor or a data line for transmitting a data signal to the transistor.

16. The display device of claim 11, wherein the conductive pattern is disposed on the encapsulation layer, and is a sensing electrode for sensing an input from a user.

17. A method of manufacturing a conductive pattern, the method comprising:
forming a metal material layer;
forming a first low reflective material layer on a first surface of the metal material layer, the first low reflective material layer including niobium carbide (NbC) and zinc oxide (ZnO); and
integrally etching the metal material layer and the first low reflective material layer by an etchant.

18. The method of claim 17, wherein an amount of the zinc oxide included in the first low reflective material layer is less than or equal to 50 atomic percent.

19. The method of claim 17, wherein an etch rate of the metal material layer by the etchant is substantially equal to an etch rate of the first low reflective material layer by the etchant.

20. The method of claim 17, further comprising:
forming a second low reflective material layer on a second surface of the metal material layer opposite to the first surface, the second low reflective material layer including niobium carbide and zinc oxide,
wherein the second low reflective material layer is integrally etched with the metal material layer and the first low reflective material layer by the etchant.

* * * * *